United States Patent
Hedblad et al.

(10) Patent No.: US 9,705,312 B2
(45) Date of Patent: Jul. 11, 2017

(54) CIRCUIT BREAKING ARRANGEMENT

(71) Applicant: ABB TECHNOLOGY LTD, Zürich (CH)

(72) Inventors: Per-Olov Hedblad, Ludvika (SE); Reza Derakhshanfar, Ludvika (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/106,542

(22) PCT Filed: Dec. 20, 2013

(86) PCT No.: PCT/EP2013/077670
§ 371 (c)(1),
(2) Date: Jun. 20, 2016

(87) PCT Pub. No.: WO2015/090440
PCT Pub. Date: Jun. 25, 2015

(65) Prior Publication Data
US 2016/0336737 A1   Nov. 17, 2016

(51) Int. Cl.
*H02H 7/22* (2006.01)
*H02H 7/30* (2006.01)
*H02H 3/05* (2006.01)
*H02H 7/26* (2006.01)
*H02J 3/36* (2006.01)
*H03K 17/10* (2006.01)
*H03K 17/12* (2006.01)

(52) U.S. Cl.
CPC ............ *H02H 7/268* (2013.01); *H02H 3/05* (2013.01); *H02J 3/36* (2013.01); *H03K 17/10* (2013.01); *H03K 17/107* (2013.01); *H03K 17/12* (2013.01); *H03K 17/127* (2013.01); *Y02E 60/60* (2013.01)

(58) Field of Classification Search
CPC ............ H02H 7/22; H02H 7/261; H02H 7/30

USPC ............................................. 361/62
See application file for complete search history.

(56) References Cited

U.S. PATENT DOCUMENTS

| | | | | |
|---|---|---|---|---|
| 5,170,129 A | * | 12/1992 | Nobue | G01R 29/24 324/678 |
| 2007/0285268 A1 | * | 12/2007 | Henze | B60R 21/01524 340/667 |
| 2013/0154740 A1 | * | 6/2013 | Xie | H03F 1/3211 330/260 |

FOREIGN PATENT DOCUMENTS

| | | |
|---|---|---|
| EP | 0 353 406 A1 | 2/1990 |
| WO | WO 2011/095212 A2 | 8/2011 |

OTHER PUBLICATIONS

Jiang et al., "MHz pulsed power generator using MOS-FET", Conference Record of the 25th International Power Modulator Symposium and 2002 High-Voltage Workshop, Hollywood, CA, Jun. 30-Jul. 3, 2002; [International Power Modulator Symposium], New York, NY : IEEE, US, Jun. 30, 2002, pp. 599-601, XP010636720, ISBN: 978-0-7803-7540-6, the whole document.

* cited by examiner

*Primary Examiner* — Dharti Patel
(74) *Attorney, Agent, or Firm* — Birch, Stewart, Kolasch & Birch, LLP

(57) ABSTRACT

A circuit breaking arrangement is adapted to be connected to a current path in at least one transmission line arranged to carry an electrical current for controllably effecting discontinuation of flow of electrical current in the at least one transmission line. The circuit breaking arrangement includes a plurality of series connections of a plurality of power semiconductor switching elements. The plurality of series connections of power semiconductor switching elements are connected in parallel relatively to each other.

21 Claims, 3 Drawing Sheets

CIRCUIT BREAKING ARRANGEMENT

TECHNICAL FIELD

The present invention generally relates to power systems such as electrical power distribution or transmission systems, e.g. High Voltage Direct Current (HVDC) power transmission systems. Specifically, the present invention relates to a circuit breaking arrangement for use e.g. in a power system.

BACKGROUND

Power systems such as electrical power distribution or transmission systems are used to supply, transmit and use electric power. High Voltage Direct Current (HVDC) power transmission is becoming increasingly important due to increasing need for power supply or delivery and interconnected power transmission and distribution systems.

Power systems such as electrical power distribution or transmission systems generally include a protection system for protecting, monitoring and controlling the operation and/or functionality of other components included in the power system. Such protection systems may for example be able to detect short circuits, overcurrents and overvoltages in power lines, transformers and/or other parts or components of the power system. The protection systems can include protection equipment such as circuit breakers for isolating any possible faults for example occurring in power transmission and distribution lines by opening or tripping the circuit breakers. After the fault has been cleared, e.g. by performing repairs and/or maintenance on the component in which the fault has been detected, the power flow can be restored by closing the circuit breakers. In alternative or in addition, the protection systems can be arranged to, upon detection of a fault in a particular route for power flow, isolate the route in which the fault has been detected and select an alternative route for the power flow. Operation of the circuit breakers may be responsive to detection of a fault condition or fault current. Upon detection of a fault condition or fault current, a mechanism may operate the circuit breaker so as to interrupt the current flowing there through. Once a fault has been detected, contacts within the circuit breaker may separate in order to interrupt the current there through. Spring arrangements, pneumatic arrangements or some other means utilizing mechanically stored energy may be employed to separate the contacts. Mechanical current interrupters may for example be employed in circuit breakers.

An HVDC grid or a DC grid may comprise multiple alternating current (AC)/DC converter terminals interconnected by transmission lines, e.g., underground cables and/or overhead lines. Within the grid, a terminal may be connected to multiple terminals resulting in different types of topologies. DC circuit breakers can be used for isolating faulty components, such as transmission lines, in HVDC and DC grids.

SUMMARY

In alternative or in addition to employing mechanical current interrupters in circuit breakers, solid-state interrupters based on semiconductor devices may be employed in the circuit breakers. Solid-state direct current (DC) circuit breakers, i.e. circuit breakers which are able to break a DC current, and which usually comprises at least one power semiconductor switch, may be implemented by means of a relatively large number of series connected power semiconductor switches. By the arrangement of a relatively large number of series connected power semiconductor switches, a sufficiently high operating voltage for the DC circuit breaker may be achieved. During normal operation of e.g. an High Voltage Direct Current (HVDC) power transmission system, an HVDC grid or a DC grid, which may include one or several DC circuit breakers, all power semiconductor switches employed in the DC circuit breaker(s) are in a conducting mode, which may correspond to a closed position, in which the power semiconductor switches are conducting current. This may expose the power semiconductor switches to continuous current stresses, which for example in HVDC applications may be relatively high. For a DC circuit breaker implemented by means of a relatively large number of series connected power semiconductor switches, if any one of power semiconductor switches would fail, e.g. due to continuous current stresses, the current through the DC circuit breaker would be interrupted, and repairs and/or replacement of any failed component in the DC circuit breaker might then become necessary in order to put the DC circuit breaker back in operation. Other factors which in addition to or on their own can cause failure of a power semiconductor switch may be overheating, overvoltage, a relatively high voltage and/or current rise, and/or switching loss.

In view of the above, a concern of the present invention is to achieve a relatively high reliability of operation of a circuit breaker or circuit breaking arrangement.

A further concern of the present invention is to achieve a relatively small need for repairs and/or replacement of any failed component in a circuit breaker or circuit breaking arrangement.

A further concern of the present invention is to achieve a relatively high redundancy for a circuit breaker or circuit breaking arrangement.

A further concern of the present invention is to achieve a relatively high redundancy for a circuit breaker or circuit breaking arrangement while at the same time allowing for a relatively small overall size of the circuit breaker or circuit breaking arrangement.

To address at least one of these concerns and other concerns, a circuit breaking arrangement in accordance with the independent claim is provided. Preferred embodiments are defined by the dependent claims.

According to a first aspect, there is provided a circuit breaking arrangement which is adapted to be connected to, or is connectable to, a current path in at least one transmission line arranged to carry an electrical current. The circuit breaking arrangement is adapted to controllably effect discontinuation of flow of electrical current in the at least one transmission line. The circuit breaking arrangement comprises at least one circuit breaking unit including a plurality of series connections of a plurality of power semiconductor switching elements. The plurality of series connections of power semiconductor switching elements are connected in parallel relatively to each other. At least two series connections of power semiconductor switching elements are connected in parallel relatively to each other such that each of a subset of the power semiconductor switching elements in one series connection of power semiconductor switching elements is individually connected in parallel to a corresponding power semiconductor switching element, or one corresponding power semiconductor switching element, in another series connections of power semiconductor switching elements.

Embodiments of the present invention are based on arranging two, or three or more, 'strings' of power semiconductor switching elements electrically connected in series, with the 'strings' being electrically connected in parallel. According to one example, the 'strings' of power semiconductor switching elements may form a structure or arrangement similar to a mesh or the like of electrical conductors which electrically interconnect power semiconductor switching elements, with the power semiconductor switching elements being arranged inbetween adjacent mesh points, which mesh may lie substantially in a common plane. By means of implementing a circuit breaker, e.g. a DC circuit breaker, by means of such 'strings' of power semiconductor switching elements, the rated current through the circuit breaker may be increased, since during normal operation, e.g. during operation where no fault has been detected, the parallel strings will share the current through the circuit breaker. In case of failure of one or more power semiconductor switching elements in the circuit breaker, other power semiconductor switching elements in the circuit breaker, e.g. including such power semiconductor switching elements which are connected in parallel to the failed power semiconductor switching element(s) in the circuit breaker, may be able to withstand the current through the circuit breaker, without requiring immediate repairs and/or replacement of any failed component in the circuit breaker. Thereby, a relatively high redundancy for the circuit breaker may be achieved. Hence, a relatively high redundancy may be achieved for a circuit breaking arrangement according to the first aspect.

Since the voltage rating of a single power semiconductor switching element may be too small as compared to the voltage levels of the power transmission, series connections of a plurality of power semiconductor switching elements may be used in order to adapt the circuit breaking arrangement to desired or required voltage ratings and/or current ratings. Each series connection of power semiconductor switching elements may in principle include any integer number of power semiconductor switching elements, which number may depend at least in part on the desired or required voltage and/or current rating of the circuit breaking arrangement. Hence, by the plurality of series connections of a plurality of power semiconductor switching elements in the circuit breaking arrangement according to the first aspect, a modular construction or arrangement, which in addition may be relatively easily adapted to desired or required voltage and/or current ratings for the circuit breaking arrangement, may be achieved.

According to embodiments of the present invention, a plurality of 'strings' of power semiconductor switching elements electrically connected in series, with the 'strings' being electrically connected in parallel, are included in the circuit breaking arrangement, In implementation, the parallel strings of series connected power semiconductor switching elements may be arranged next to each other, e.g. on some support or substrate, and/or on top of each other. Electrical connection between the parallel strings may be achieved for example by means of flexible current busbars, and/or by means of other appropriate electrical connectors. Thereby, a relatively compact arrangement of the parallel strings may be achieved, and/or a relatively small surface area may be required for implementation of a circuit breaking arrangement according to the first aspect. In other words, a circuit breaking arrangement according to the first aspect may occupy a relatively small surface area.

According to an example, each power semiconductor switching elements is connected to a snubber circuit and a gate unit. According to another example, two or more parallel strings may share a common snubber circuit, or corresponding power semiconductor switching elements in two or more parallel strings may share a common snubber circuit.

The subset of the power semiconductor switching elements in one series connection of power semiconductor switching elements may include only some of the power semiconductor switching elements in the series connection, i.e. with the subset being a 'proper' subset, or the entire set of power semiconductor switching elements in the series connection. For example, at least two series connections of power semiconductor switching elements may be connected in parallel relatively to each other such that a proper subset of the power semiconductor switching elements in one series connections of power semiconductor switching elements is individually connected in parallel to a corresponding power semi-conductor switching element in another series connections of power semiconductor switching elements. In the context of the present application, by a proper subset of the power semi-conductor switching elements in one series connections of power semiconductor switching elements it is meant a subset of the power semiconductor switching elements in one series connections of power semiconductor switching elements that is not equal to the complete set of the power semiconductor switching elements in one series connections of power semi-conductor switching elements.

As mentioned in the foregoing, the subset of the power semiconductor switching elements in one series connection of power semiconductor switching elements may include all of the power semiconductor switching elements in the series connection. For example, according to an embodiment of the present invention, at least two series connections of power semiconductor switching elements may be connected in parallel relatively to each other such that each power semiconductor switching element in one series connection of power semiconductor switching elements is individually connected in parallel to a corresponding power semiconductor switching element in another series connections of power semiconductor switching elements.

The circuit breaking arrangement may for example be adapted to be connected in series to a current path in the at least one transmission line.

According to a second aspect, there is provided a power system including at least one transmission line arranged to carry an electrical current, and a circuit breaking arrangement according to the first aspect. The circuit breaking arrangement is connected to a current path in the at least one transmission line, for controllably effecting discontinuation of flow of electrical current in the at least one transmission line.

The power system may for example comprise a HVDC power transmission system and/or a DC power grid.

At least one of the power semiconductor switching elements may be controllable with respect to switching operation. At least one of the power semiconductor switching elements may comprise at least one power semiconductor switch, which may be controllable with respect to switching operation. For example, at least one of the power semiconductor switching elements may comprise a power semiconductor switch and a diode connected in parallel with the power semiconductor switch. The power semiconductor switch may for example be based on, or be selected from, an insulated-gate bipolar transistor (IGBT), a metal-oxide semiconductor field effect transistor (MOSFET), an integrated gate-commutated thyristor (IGCT) and/or a gate turn-off thyristor (GCT). Switches of these types belong to the group of power semiconductor switches which are controllable with respect to switching operation, or have selective turn-on and turn-off capability.

The circuit breaking arrangement may comprise a plurality of circuit breaking units, which may be connected in series to each other.

A non-linear resistor may be provided for at least one circuit breaking unit, or for each circuit breaking unit. The non-linear resistor may for example be connected in parallel with the circuit breaking unit.

The circuit breaking arrangement may comprise at least one so called snubber circuit. A snubber circuit may enable or facilitate limiting voltage and/or current rise and/or overvoltage during switching on and off of a power semiconductor switching element in a circuit breaking arrangement according to an embodiment of the present invention.

For example, the circuit breaking arrangement may comprise at least one snubber circuit connected to at least one of the power semiconductor switching elements.

According to one example, at least one snubber circuit may be connected to each power semiconductor switching element of the subset of the power semiconductor switching elements and to the corresponding power semiconductor switching element in the other series connection of power semiconductor switching elements.

According to another example, at least one snubber circuit may be connected to each of the power semiconductor switching elements in the one series connection of power semiconductor switching elements and to the corresponding power semiconductor switching element in the other series connection of power semiconductor switching elements.

According to an example, there may be provided a current limiting reactor, e.g. an inductor, which for example may be arranged so as to be connected in series with the transmission line and/or the circuit breaking arrangement. According to another example, in alternative or in addition, a residual current disconnecting circuit breaker unit may be arranged so as to be connected in series with the transmission line and/or circuit breaking arrangement. Alternatively or optionally, at least one additional component, such as a current limiting reactor, a gate unit and/or a residual current disconnecting circuit breaker unit may be included in the circuit breaking arrangement.

Further objects and advantages of the present invention are described in the following by means of exemplifying embodiments.

It is noted that the present invention relates to all possible combinations of features recited in the claims. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

Exemplifying embodiments of the invention will be described below with reference to the accompanying drawings.

In the accompanying drawings, the same reference numerals denote the same or similar elements throughout the views.

DETAILED DESCRIPTION

The present invention will now be described more fully hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the invention to those skilled in the art. Furthermore, like numbers refer to the same or similar elements or components throughout.

Figure 1:
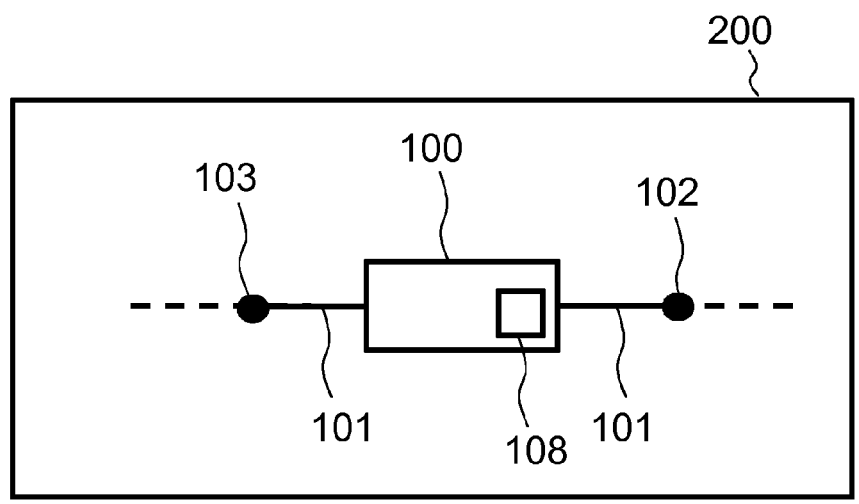
FIG. 1 is a schematic block diagram of a power system according to an embodiment of the present invention.

Referring now to FIG. 1, there is shown a schematic block diagram of a power system 200 according to an embodiment of the present invention. The power system 200 includes a circuit breaking arrangement 100 according to an embodiment of the present invention, e.g. such as described in the following with reference to any one of FIGS. 2-4. The circuit breaking arrangement 100 is adapted to be connected to a transmission line 101, arranged to carry an electrical current, for controllably effecting discontinuation of flow of electrical current in the transmission line 101. In FIG. 1, a portion of transmission line 101 arranged to carry electrical current between terminals 102 and 103 is shown. It is to be understood that the transmission line 101 is a part or portion of the power system 200, which e.g. may include or be constituted by a power transmission system such as an High Voltage Direct Current (HVDC) power transmission system, or an HVDC grid or a direct current (DC) grid. Any other components which may be included in the power system 200 are however not shown in FIG. 1. The transmission line 101 may for example be a power transmission line such as a DC cable, an overhead line (OHL), or a combination of DC cable and OHL. The circuit breaking arrangement 100 may comprise at least one snubber circuit 108, which will be further described in the following.

Figure 2:
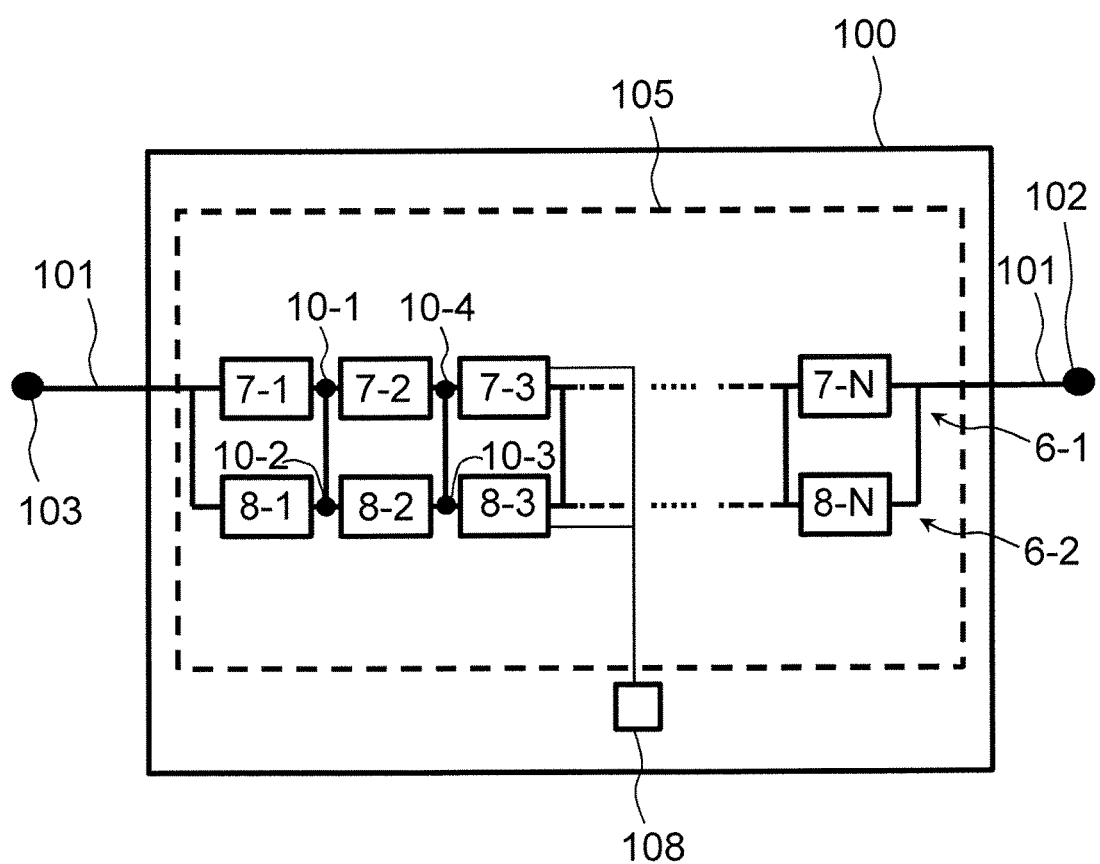

Referring now to FIG. 2, there is shown a schematic block diagram of (portions of) a circuit breaking arrangement 100 according to an embodiment of the present invention. The circuit breaking arrangement 100 is adapted to be connected to a transmission line 101, arranged to carry an electrical current, for controllably effecting discontinuation of flow of electrical current in the transmission line 101. In FIG. 2, a portion of transmission line 101 arranged to carry electrical current between terminals 102 and 103 is shown. The circuit breaking arrangement 100 comprises a circuit breaking unit 105 which includes two series connections 6-1, 6-2 of a plurality of power semiconductor switching elements 7-1, 7-2, 7-3, . . . , 7-N, and 8-1, 8-2, 8-3, . . . , 8-N, respectively. According to the embodiment illustrated in FIG. 2, each series connection 6-1, 6-2 of power semiconductor switching elements includes N power semiconductor switching elements. N may in principle be any integer equal to or larger than two, e.g. three, four, five, six, ten, fifteen, twenty, fifty, a hundred or even larger.

N may depend at least in part on the desired or required voltage and/or current rating of the circuit breaking arrangement 100. Since the voltage rating of a single power semiconductor switching element may be too small as compared to the voltage levels of the power transmission, series connections of a plurality of power semiconductor switching elements can be used to achieve the required voltage rating and/or current rating. For example for high voltage applications where the voltage is about 100 kV or several hundreds of kV, there may be arranged a hundred or even several hundreds of power semiconductor switching elements in a series connection of power semiconductor switching elements.

As illustrated in FIG. 2, the series connections 6-1, 6-2 of power semiconductor switching elements are connected in parallel relatively to each other. According to the example depicted in FIG. 2, 'strings' of power semiconductor switching elements 7-1, 7-2, 7-3, . . . , 7-N, and 8-1, 8-2, 8-3, . . . , 8-N, respectively, form a structure or arrangement similar to a mesh or the like of electrical conductors which electrically interconnect power semiconductor switching elements 7-1, 7-2, 7-3, . . . , 7-N, 8-1, 8-2, 8-3, . . . , 8-N, with the power semiconductor switching elements 7-1, 7-2, 7-3, . . . , 7-N, 8-1, 8-2, 8-3, . . . , 8-N being arranged inbetween adjacent mesh points. Some of the mesh points are indicated in FIG. 2 by the reference numerals 10-1, 10-2, 10-3 and 10-4. According to the embodiment illustrated in FIG. 2, each power semiconductor switching element 7-1, 7-2, 7-3, . . . , 7-N in the series connection 6-1 of power semiconductor switching elements is individually connected in parallel to a corresponding power semiconductor switching element 8-1, 8-2, 8-3, . . . , 8-N in the series connections 6-2 of power semiconductor switching elements.

It is to be noted that FIG. 2 illustrates an exemplifying, non-limiting embodiment of the present invention. For example, the mesh-like structure or arrangement illustrated in FIG. 2 is according to an example. In general, at least two series connections of power semiconductor switching elements may be connected in parallel relatively to each other, such that each of a subset of the power semiconductor switching elements in one series connection of power semiconductor switching elements is individually connected in parallel to a corresponding power semiconductor switching element in another series connections of power semiconductor switching elements.

With further reference to FIG. 2, by means of such 'strings' of power semi-conductor switching elements, 7-1, 7-2, 7-3, . . . , 7-N, and 8-1, 8-2, 8-3, . . . , 8-N, respectively (i.e. series connections 6-1, 6-2), the rated current through the circuit breaking arrangement 100 may be relatively high. This may at least in part be due to that during normal operation of the circuit breaking arrangement 100, e.g. during operation of the circuit breaking arrangement 100 where no fault has been detected and current passes through the circuit breaking arrangement 100, the parallel series connections 6-1, 6-2 will share the current through the circuit breaking arrangement 100.

In case of failure of one or more of the power semiconductor switching elements 7-1, 7-2, 7-3, . . . , 7-N, 8-1, 8-2, 8-3, . . . , 8-N, other, non-faulty power semiconductor switching elements, at least some of which may be connected in parallel to the failed power semiconductor switching element(s), may be able to withstand the current through the circuit breaking arrangement 100 without requiring immediate repairs and/or replacement of any failed component in the circuit breaking arrangement 100. For example, with reference to FIG. 2, during operation of the circuit breaking arrangement 100 where no fault has been detected and current passes through the circuit breaking arrangement 100, the parallel series connections 6-1, 6-2 share the current through the circuit breaking arrangement 100. A failure of for example power semiconductor switching element 7-2 may then occur. However, the current through the circuit breaking arrangement 100 may still not be interrupted, since current, instead of passing from mesh point 10-1 to mesh point 10-4 via power semiconductor switching element 7-2, can pass from mesh point 10-1 to mesh point 10-4 via a route from mesh point 10-1 to mesh point 10-2, and from mesh point 10-2 to mesh point 10-3 via power semiconductor switching element 8-2, and then from mesh point 10-3 to mesh point 10-4. The same or a similar principle may apply to a scenario where one or more other power semiconductor switching elements of the circuit breaking arrangement 100 fail.

Figure 3:
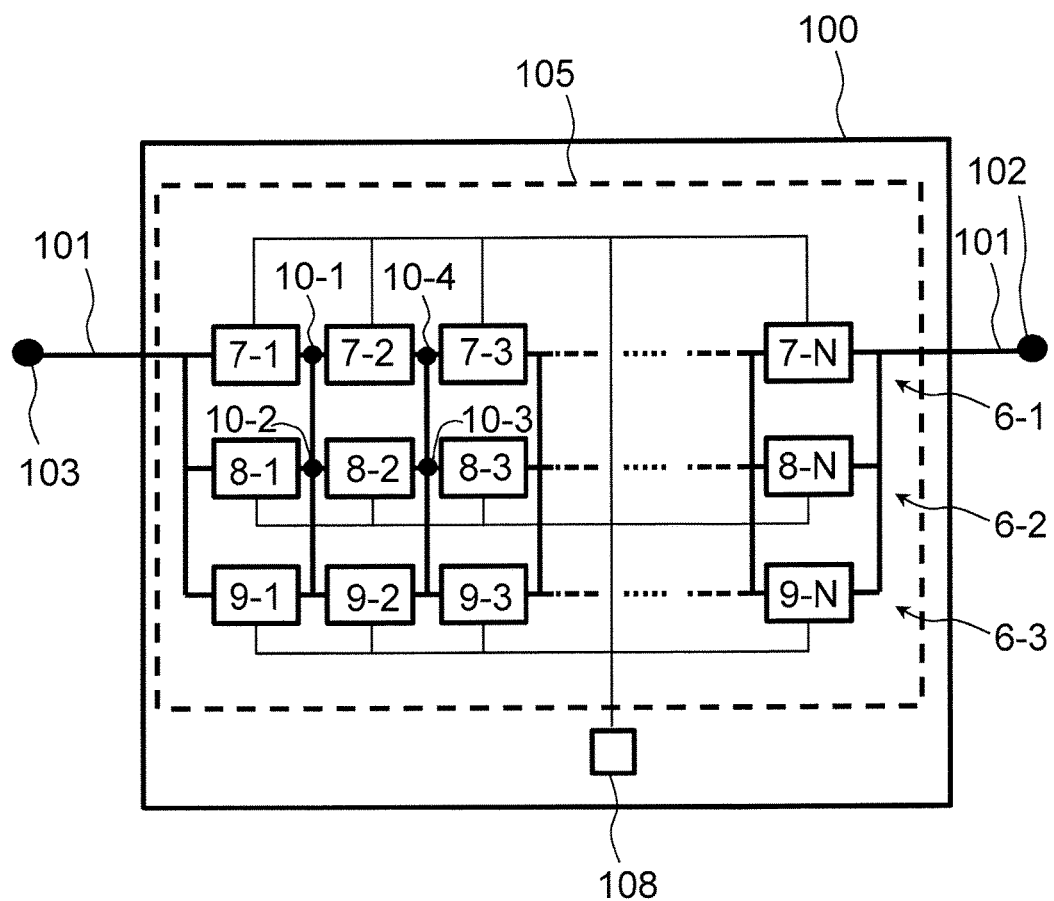

Referring now to FIG. 3, there is shown a schematic block diagram of (portions of) a circuit breaking arrangement 100 according to an embodiment of the present invention. The circuit breaking arrangement 100 depicted in FIG. 3 is similar to that depicted in FIG. 2. Compared to the circuit breaking arrangement 100 depicted in FIG. 2, the circuit breaking arrangement 100 depicted in FIG. 3 includes three series connections 6-1, 6-2, 6-3 of a plurality of power semiconductor switching elements 7-1, 7-2, 7-3, . . . , 7-N; 8-1, 8-2, 8-3, . . . , 8-N; and 9-1, 9-2, 9-3, . . . , 9-N, respectively, each series connection 6-1, 6-2, 6-3 of power semiconductor switching elements including N power semiconductor switching elements.

According to FIGS. 2 and 3 the number of series connections of power semiconductor switching elements, with the series connections being connected in parallel relatively to each other, are two and three, respectively. In general however, the circuit breaking arrangement may according to different embodiments of the present invention include in principle any number of series connections of power semiconductor switching elements with the series connections being connected in parallel relatively to each other, e.g. four, five, six, ten, twelve, fifteen, or twenty or more.

Figure 4:
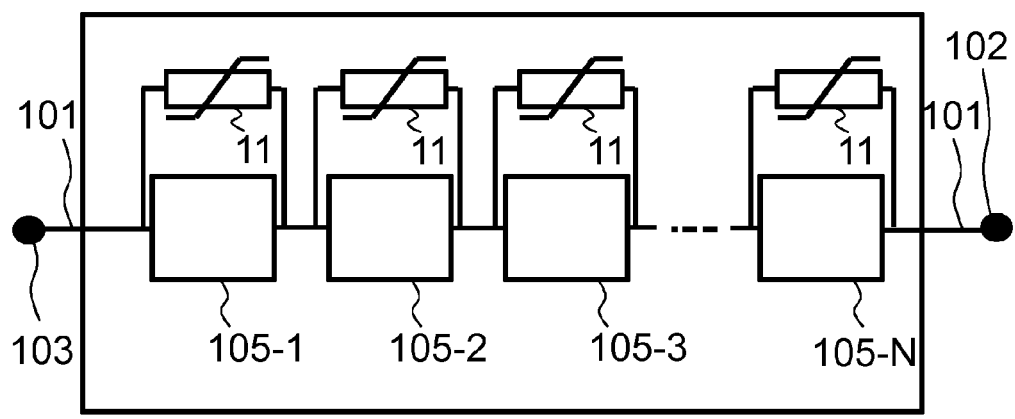
FIGS. 2-4 are schematic block diagrams of circuit breaking arrangements according to different embodiments of the present invention.

Referring now to FIG. 4, there is shown a schematic block diagram of (portions of) a circuit breaking arrangement 100 according to an embodiment of the present invention. The circuit breaking arrangement 100 comprises a plurality of circuit breaking units 105-1, 105-2, 105-3, . . . , 105-N. The circuit breaking arrangement 100 is adapted to be connected to a transmission line 101, arranged to carry an electrical current, for controllably effecting discontinuation of flow of electrical current in the transmission line 101. In FIG. 4, a portion of transmission line 101 arranged to carry electrical current between terminals 102 and 103 is shown.

Each of the circuit breaking units 105-1, 105-2, 105-3, . . . , 105-N includes a plurality of series connections of a plurality of power semiconductor switching elements (not shown in FIG. 4, see FIG. 2 or FIG. 3), with the plurality of series connections of power semiconductor switching elements being connected in parallel relatively to each other. At least two series connections of power semiconductor switching elements may be connected in parallel relatively to each other such that each of a subset of the power semiconductor switching elements in one series connection of power semiconductor switching elements is individually connected in parallel to a corresponding power semiconductor switching element in another series connections of power semiconductor switching elements. For example, each of the circuit breaking units 105-1, 105-2, 105-3, . . . , 105-N may be arranged similar to or the same as the circuit breaking unit 105 described in the foregoing with reference to FIG. 2 or FIG. 3.

According to the embodiment illustrated in FIG. 4, the circuit breaking arrangement 100 comprises N circuit breaking units 105-1, 105-2, 105-3, . . . , 105-N. It is to be understood that in general N may in principle be any integer equal to or larger than one e.g. two, three, four, five, six, ten, fifteen, twenty, fifty, a hundred or even larger.

According to the embodiment illustrated in FIG. 4, a non-linear resistor 11 may be connected in parallel with each of the circuit breaking units 105-1, 105-2, 105-3, ..., 105-N.

With further reference to FIG. 4, during normal operation, i.e. when no fault current or fault condition, for example occurring in the transmission line 101, has been detected, electrical current passes through the circuit breaking units 105-1, 105-2, 105-3, ..., 105-N, since during normal operation the circuit breaking units 105-1, 105-2, 105-3, ..., 105-N are in a conducting state, for example by means of the power semiconductor switching elements in the circuit breaking units 105-1, 105-2, 105-3, ..., 105-N being turned on, and hence being in a conducting state.

On detection of a fault current or fault condition, an opening signal can be generated for and transmitted to at least one of the circuit breaking units 105-1, 105-2, 105-3, ..., 105-N. Such generation and transmission of opening signals may be achieved e.g. by means of some protection system for protecting, monitoring and controlling the operation and/or functionality of other components included in the power system. Such a protection system may for example in case of detection of a fault current or fault condition transmit the opening signals in a wired and/or wireless manner to the at least one of the circuit breaking units 105-1, 105-2, 105-3, ..., 105-N. Responsive to an opening signal being generated for the at least one of the circuit breaking units 105-1, 105-2, 105-3, ..., 105-N, the at least one of the circuit breaking units 105-1, 105-2, 105-3, ..., 105-N can be opened, i.e. turned off so as to be in a non-conductive state or substantially non-conductive state, for example by means of the power semiconductor switching elements in the at least one of the circuit breaking units 105-1, 105-2, 105-3, ..., 105-N being turned off, and hence being in a non-conducting state or substantially non-conducting state. The electrical current may then commutate over to the non-linear resistor or resistors 11 which correspond to the at least one circuit breaking unit 105-1, 105-2, 105-3, ..., 105-N, whereby the current level can be reduced and the voltage can be limited.

With reference to any one of the embodiments described herein, at least one of the power semiconductor switching elements may comprise at least one power semiconductor switch and may for example be based on, or be selected from, an IGBT, a MOSFET, an IGCT and/or a GCT. Switches of these types belong to the group of power semiconductor switches which are controllable with respect to switching operation, or have selective turn-on and turn-off capability.

Referring now again to FIG. 1, and with reference to any one of the embodiments illustrated in FIGS. 1-4, the circuit breaking arrangement 100 may comprise at least one snubber circuit 108. A snubber circuit 108 may enable or facilitate limiting voltage and/or current rise and/or overvoltage during switching on and off of a power semiconductor switching element in a circuit breaking arrangement 100 according to an embodiment of the present invention. The circuit breaking arrangement 100 may comprise at least one snubber circuit 108 connected to at least one of the power semiconductor switching elements in the circuit breaking arrangement 100. According to another example (e.g., the embodiment shown in FIG. 2), at least one snubber circuit 108 may be connected to each power semiconductor switching element of the subset of the power semiconductor switching elements and to the corresponding power semiconductor switching element in the other series connection of power semiconductor switching elements. According to yet another example (e.g., the embodiment shown in FIG. 3), at least one snubber circuit 108 may be connected to each of the power semiconductor switching elements in the one series connection of power semiconductor switching elements and to the corresponding power semiconductor switching element in the other series connection of power semiconductor switching elements.

With reference to any one of the embodiments described herein, the circuit breaking arrangement 100 may comprise additional components other to those shown in the drawings.

Further with reference to any one of the embodiments described herein, according to an example, there may be provided a current limiting reactor (not shown in the drawings), e.g. an inductor, which for example may be arranged so as to be connected in series with the transmission line 101, between terminal 103 and circuit breaking arrangement 100 and/or between terminal 102 and circuit breaking arrangement 100. According to another example, in alternative or in addition, a residual current disconnecting circuit breaker unit (not shown in the drawings) may be arranged so as to be connected in series with the transmission line 101, between terminal 103 and circuit breaking arrangement 100 and/or between terminal 102 and circuit breaking arrangement 100. Alternatively or optionally, e.g. a current limiting reactor and/or a residual current disconnecting circuit breaker unit may be included in the circuit breaking arrangement 100.

In conclusion, embodiments of the present invention disclose a circuit breaking arrangement which is adapted to be connected, or connectable to, to a current path in at least one transmission line which is arranged to carry an electrical current for controllably effecting discontinuation of flow of electrical current in the at least one transmission line. The circuit breaking arrangement comprises a plurality of series connections of a plurality of power semi-conductor switching elements. The plurality of series connections of power semiconductor switching elements are connected in parallel relatively to each other.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

The invention claimed is:

1. A circuit breaking arrangement adapted to be connected to a current path in at least one transmission line arranged to carry an electrical current for controllably effecting discontinuation of flow of electrical current in the at least one transmission line, the circuit breaking arrangement comprising:

at least one circuit breaking unit including a plurality of series connections of a plurality of power semiconductor switching elements, the plurality of series connections of power semiconductor switching elements being connected in parallel relatively to each other, wherein at least two series connections of power semiconductor switching elements are connected in parallel relatively to each other such that each of a subset of the power semiconductor switching elements in one series connection of power semiconductor switching elements is individually connected in parallel to a corresponding power semiconductor switching element in another series connections of power semiconductor switching elements, and wherein the series connections of power semiconductor switching elements are arranged next to each other and/or on top of each other, and wherein the series connections of power semiconductor switching elements are electrically connected to each other by means of flexible current busbars without any intervening capacitors or any intervening switching elements.

2. The circuit breaking arrangement according to claim 1, wherein at least two series connections of power semiconductor switching elements are connected in parallel relatively to each other such that each power semiconductor switching element in one series connection of power semiconductor switching elements is individually connected in parallel to a corresponding power semiconductor switching element in another series connections of power semiconductor switching elements.

3. The circuit breaking arrangement according to claim 2, wherein at least one of the power semiconductor switching elements is controllable with respect to switching operation.

4. The circuit breaking arrangement according to claim 2, further comprising at least one snubber circuit connected to at least one of the power semi-conductor switching elements, wherein at least one snubber circuit is connected to each power semiconductor switching element of the subset of the power semiconductor switching elements and to the corresponding power semiconductor switching element in the other series connection of power semiconductor switching elements.

5. The circuit breaking arrangement according to claim 2, further comprising at least one snubber circuit connected to at least one of the power semi-conductor switching, wherein at least one snubber circuit is connected to each of the power semiconductor switching elements in the one series connection of power semiconductor switching elements and to the corresponding power semiconductor switching element in the other series connection of power semiconductor switching elements.

6. A power system, comprising:
at least one transmission line arranged to carry an electrical current; and
the circuit breaking arrangement according to claim 2 connected to a current path in the at least one transmission line for controllably effecting discontinuation of flow of electrical current in the at least one transmission line.

7. The circuit breaking arrangement according to claim 1, wherein at least one of the power semiconductor switching elements is controllable with respect to switching operation.

8. The circuit breaking arrangement according to claim 7, wherein the at least one of the power semiconductor switching elements which is controllable with respect to switching operation comprises at least one power semiconductor switch which is insulated-gate bipolar transistor, metal-oxide semiconductor field effect transistor, integrated gate-commutated thyristor, and/or gate turn-off thyristor based.

9. The circuit breaking arrangement according to claim 8, further comprising at least one snubber circuit connected to at least one of the power semi-conductor switching elements, wherein at least one snubber circuit is connected to each power semiconductor switching element of the subset of the power semiconductor switching elements and to the corresponding power semiconductor switching element in the other series connection of power semiconductor switching elements.

10. The circuit breaking arrangement according to claim 8, further comprising at least one snubber circuit connected to at least one of the power semi-conductor switching, wherein at least one snubber circuit is connected to each of the power semiconductor switching elements in the one series connection of power semiconductor switching elements and to the corresponding power semiconductor switching element in the other series connection of power semiconductor switching elements.

11. A power system, comprising:
at least one transmission line arranged to carry an electrical current; and
the circuit breaking arrangement according to claim 8 connected to a current path in the at least one transmission line for controllably effecting discontinuation of flow of electrical current in the at least one transmission line.

12. The circuit breaking arrangement according to claim 7, further comprising at least one snubber circuit connected to at least one of the power semi-conductor switching elements, wherein at least one snubber circuit is connected to each power semiconductor switching element of the subset of the power semiconductor switching elements and to the corresponding power semiconductor switching element in the other series connection of power semiconductor switching elements.

13. The circuit breaking arrangement according to claim 7, further comprising at least one snubber circuit connected to at least one of the power semi-conductor switching, wherein at least one snubber circuit is connected to each of the power semiconductor switching elements in the one series connection of power semiconductor switching elements and to the corresponding power semiconductor switching element in the other series connection of power semiconductor switching elements.

14. A power system, comprising:
at least one transmission line arranged to carry an electrical current; and
the circuit breaking arrangement according to claim 7 connected to a current path in the at least one transmission line for controllably effecting discontinuation of flow of electrical current in the at least one transmission line.

15. The circuit breaking arrangement according to claim 1, further comprising at least one snubber circuit connected to at least one of the power semi-conductor switching elements, wherein at least one snubber circuit is connected to each power semiconductor switching element of the subset of the power semiconductor switching elements and to the corresponding power semiconductor switching element in the other series connection of power semiconductor switching elements.

16. The circuit breaking arrangement according to claim 15, further comprising at least one snubber circuit connected to at least one of the power semi-conductor switching, wherein at least one snubber circuit is connected to each of the power semiconductor switching elements in the one series connection of power semiconductor switching elements and to the corresponding power semiconductor switching element in the other series connection of power semiconductor switching elements.

17. The circuit breaking arrangement according to claim 1, further comprising at least one snubber circuit connected to at least one of the power semi-conductor switching, wherein at least one snubber circuit is connected to each of the power semiconductor switching elements in the one series connection of power semiconductor switching elements and to the corresponding power semiconductor switching element in the other series connection of power semiconductor switching elements.

18. A power system, comprising:
at least one transmission line arranged to carry an electrical current; and
the circuit breaking arrangement according to claim 1 connected to a current path in the at least one transmission line for controllably effecting discontinuation of flow of electrical current in the at least one transmission line.

19. The power system according to claim 18, wherein the power system comprises a High Voltage Direct Current power transmission system.

20. The power system according to claim 18, wherein the power system comprises a direct current power grid.

21. The circuit breaking arrangement according to claim 1, wherein the series connections of power semiconductor switching elements are directly electrically connected to each other by means of the flexible current busbars.

\* \* \* \* \*